US009202581B1

(12) United States Patent
Kamei (10) Patent No.: US 9,202,581 B1
(45) Date of Patent: Dec. 1, 2015

(54) SENSING METHOD FOR A FLASH MEMORY AND MEMORY DEVICE THEREWITH

(71) Applicant: MACRONIX International Co., Ltd., Hsinchu (TW)

(72) Inventor: Teruhiko Kamei, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/496,884

(22) Filed: Sep. 25, 2014

(51) Int. Cl.
| | |
|---|---|
| *G11C 16/26* | (2006.01) |
| *G11C 16/24* | (2006.01) |
| *G11C 7/12* | (2006.01) |
| *G11C 16/04* | (2006.01) |
| *G11C 5/06* | (2006.01) |
| *G11C 11/4091* | (2006.01) |
| *G11C 16/14* | (2006.01) |
| *G11C 11/56* | (2006.01) |
| *G11C 5/02* | (2006.01) |

(52) U.S. Cl.
CPC ................ *G11C 16/26* (2013.01); *G11C 16/14* (2013.01); *G11C 16/24* (2013.01); *G11C 5/02* (2013.01); *G11C 5/025* (2013.01); *G11C 5/06* (2013.01); *G11C 7/12* (2013.01); *G11C 11/5642* (2013.01); *G11C 16/0483* (2013.01); *G11C 2213/71* (2013.01)

(58) Field of Classification Search
CPC .... G11C 16/0483; G11C 16/26; G11C 16/24; G11C 7/12; G11C 5/02; G11C 5/025; G11C 11/5642; G11C 2213/71
USPC .................. 365/203, 185.17, 185.11, 185.24, 365/185.25
See application file for complete search history.

(56) References Cited

U.S. PATENT DOCUMENTS

| | | | | |
|---|---|---|---|---|
| 5,680,347 | A | * 10/1997 | Takeuchi | ................ G11C 7/12 365/185.05 |
| 8,503,213 | B2 | 8/2013 | Chen et al. | |
| 8,559,225 | B2 | 10/2013 | Lee et al. | |
| 8,587,998 | B2 | 11/2013 | Hung | |
| 2006/0083071 | A1 | * 4/2006 | Nagashima | ........ G11C 16/0483 365/185.28 |
| 2008/0158971 | A1 | * 7/2008 | Lee | .................... G11C 16/3418 365/185.17 |
| 2008/0273397 | A1 | * 11/2008 | Hendrickson | ............ G11C 7/12 365/185.25 |
| 2012/0148676 | A1 | 6/2012 | Little | |

OTHER PUBLICATIONS

H.Tanaka, et al., "Bit Cost Scalable Technology with Punch and Plug Process for Ultra High Density Flash Memory," 2007 IEEE Symposium on VLSI Technology, Jun. 12-14, 2007, pp. 14-15.

* cited by examiner

*Primary Examiner* — Ly D Pham
(74) *Attorney, Agent, or Firm* — J.C. Patents (57) ABSTRACT

A sensing method for a flash memory to improve read time of separate sensing in each bit line pair is introduced herein. The sensing method improves read time of even/odd BL separate sensing by, for example, charge time saving for sensing each of the bit lines during reading. In the method, both of the even bit line and the odd bit line are charged to a charge level. The voltage level of the odd bit line is maintained at the charge level and memory cells associated with the even bit line are sensed for reading data stored in the memory cells. The voltage level of the even bit line is discharged to ground, and the voltage level of the odd bit line is maintained at the charge level and sensed for reading data stored in the memory cells associated with the odd bit line.

15 Claims, 12 Drawing Sheets

SENSING METHOD FOR A FLASH MEMORY AND MEMORY DEVICE THEREWITH

TECHNICAL FIELD

The technical field relates to a method for reducing the capacitive coupling loading between adjacent bit lines, and more particularly relates to a sensing method to improve read time of even/odd BL separate sensing by pre-charge time saving for sensing each of the bit lines during reading.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit.

A structure that provides vertical NAND cells in a charge trapping memory technology is described in Tanaka et al., "Bit Cost Scalable Technology with Punch and Plug Process for Ultra High Density Flash Memory", 2007 Symposium on VLSI Technology Digest of Technical Papers; 12-14 Jun. 2007, pages: 14-15. The structure described in Tanaka et al. includes a multi-gate field effect transistor structure having a vertical channel which operates like a NAND gate, using silicon-oxide-nitride-oxide-silicon SONOS charge trapping technology to create a storage site at each gate/vertical channel interface. The memory structure is based on a pillar of semiconductor material arranged as the vertical channel for the multi-gate cell, with a lower select gate adjacent the substrate, and an upper select gate on top. A plurality of horizontal control gates is formed using planar electrode layers that intersect with the pillars. The planar electrode layers used for the control gates do not require critical lithography, and thereby save costs.

The drawback of the 3-D memory structure of the prior art is that the read throughput is reduced because of the need to shield the adjacent bit line coupling effect. An odd-even architecture is proposed for the 3-D memory structure for the adjacent bit line coupling effect. In each read, either even or odd global bit lines are read. The adjacent global bit lines serve a shielding purpose. In this kind of the memory structure, only one-second of the bit lines is accessed in one read operation.

In the odd-even architecture, separate sensing between even and odd bit lines is widely used to avoid bit line to bit line (BL-BL) coupling noise during sensing. When either of even bit lines or odd bit lines is read, the other bit lines are fixed at ground to shield from BL-BL coupling noise. Although separate sensing between even and odd bit lines is more reliable and is easier to design than all BL simultaneous sensing, read time is much longer.

SUMMARY

Techniques are described herein for reducing the capacitive coupling loading between adjacent global bit lines. One or some of exemplary embodiments provide a sensing method for a flash memory to improve read time of separate sensing in each bit line pair, as in between even bit lines and odd bit lines. In one of exemplary embodiments, the sensing method improves read time of even/odd BL separate sensing by, for example, pre-charge time saving for sensing each of the bit lines during reading.

One of exemplary embodiments provides a sensing method for a memory device, which comprises a plurality of bit line pairs, each of the bit line pair comprising an odd bit line and an even bit line. In the method, a sensing method for a memory device which includes an odd bit line and an even bit line in a plurality of bit lines. In the method, both of the even bit line and the odd bit line are pre-charged to a pre-charge level. The voltage level of the odd bit line is maintained at the pre-charge level while memory cells associated with the even bit line are sensed. Memory cells associated with the odd bit line are sensed.

In the example of the aforesaid sensing method for the memory device, where the memory device comprises a block of memory cells comprising a plurality of levels, each level comprising strips of the memory cells extending between first and second ends of the block of memory cells, each of the even bit lines and the odd bit lines being operably coupled to a string of the memory cells through a switch. In the method, before pre-charging both of the even bit line and the odd bit line of the bit line pair, switches controlling either the even bit lines or the odd bit lines are programmed to a positive threshold voltage and the other ones are erased to a negative threshold voltage.

One of exemplary embodiments comprises a sensing method for a memory device, which comprises a set of even bit lines operably coupled to first bit line structures at a plurality of levels at a first end of the memory device, and a set of odd bit lines operably coupled to second bit line structures at the plurality of levels at a second end of the memory device, the even and odd bit lines at each level being interleaved. In the sensing method, comprising: during a read operation, both of the even bit lines and the odd bit lines are pre-charged to a pre-charge level. The voltage level of each of the odd bit lines is maintained at the pre-charge level while the memory cells associated with each of the even bit lines are sensed for reading data stored in the memory cells associated with the even bit line. The voltage level of each of the even bit line is discharged to ground, and the voltage level of each of the odd bit line is maintained at the pre-charge level, and the memory cells associated with the odd bit line for reading data stored in the memory cells associated with the odd bit line.

In the example of the aforesaid sensing method for the memory device, before pre-charging both of the even bit lines and the odd bit lines programming switches controlling either the even bit lines or the odd bit lines to a positive threshold voltage and erasing the other one to a negative threshold voltage.

One of exemplary embodiments provides a memory device. The memory device includes a block of memory cells, a first bit line structure, a second bit line structure, a plurality of bit line pairs extending in the first direction, a pre-charge circuit and a sensing circuit. The block of memory cells comprises a plurality of levels, where each level comprises strips of memory cells extending in a first direction between first and second ends of the block of memory cells. The first bit line structure at each level is at the first end of the block of memory cells and each first bit line structure operably is coupled to a first string of memory cells extending from said first end. The second bit line structure at each level is at the second end of the block of memory cells and each second bit line structure is operably coupled to a second string of memory cells extending from said second end. The plurality of bit line pairs is extending in the first direction, and each bit line pair comprises a first bit line and a second bit line, where each of the first bit lines or the second bit lines for a series of bit line pairs is operated by a bit line of an adjacent pair of the bit lines. The pre-charge circuit, during a read operation, pre-charges both of the first bit lines and the second bit lines, and operably maintains the voltage level of each of the first bit lines and the second bit lines at the pre-charge level. The sensing circuit, during the read operation, senses the memory cells associated with each of the first bit lines while the voltage level of the second bit lines is maintained at the pre-charge level while, and consecutively senses the memory cells associated with each of the second bit lines after the voltage level of each of the first bit line being discharged to ground and the voltage level of each of the second bit lines is maintained at the pre-charge level.

One of exemplary embodiments provides a memory device. The memory device includes a set of first bit lines, a set of even bit lines, a pre-charge circuit and a sensing circuit. The set of first bit lines is operably coupled to first bit line structures at a plurality of levels at a first end of the memory device. The set of even bit lines is operably coupled to second bit line structures at the plurality of levels at a second end of the memory device, where the first and second bit lines at each level are interleaved in each of bit line pairs. The pre-charge circuit, during a read operation, pre-charges both of the first bit lines and the second bit lines, and operably maintains the voltage level of each of the first bit lines and the second bit lines at the pre-charge level. The sensing circuit, during the read operation, sensing the memory cells associated with each of the first bit lines when the voltage level of each of the second bit lines is maintained at the pre-charge level while, and consecutively senses the memory cells associated with each of the second bit lines after the voltage level of each of the first bit line is discharged to ground and the voltage level of each of the second bit lines is maintained at the pre-charge level.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments, and together with the description, serve to explain the principles of the disclosure.

DETAILED DESCRIPTION OF DISCLOSED EMBODIMENTS

One exemplary embodiment of a sensing method for a flash memory applied in a three-dimensional vertical gate (3DVG) NAND Flash memory is introduced, but not limited thereto.

Figure 1:
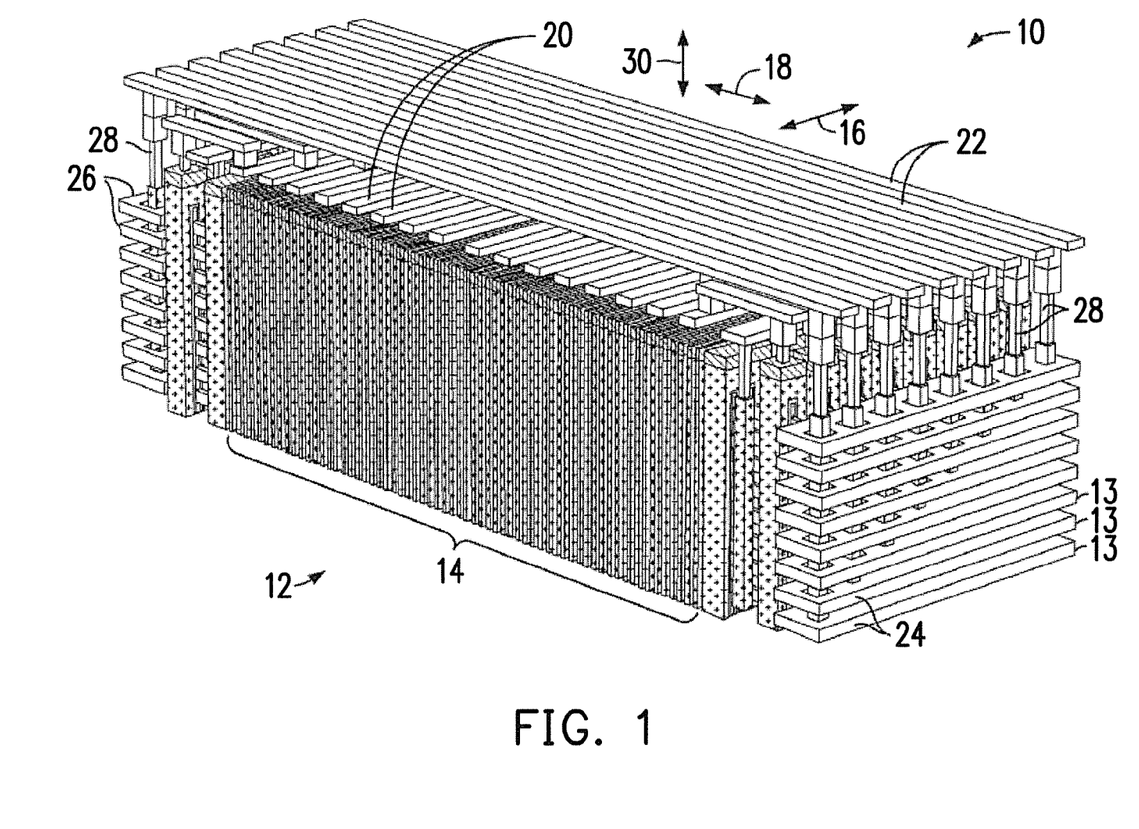
FIGS. 1 and 2 illustrate a 3-D memory device including a block of memory cells.
Figure 2:
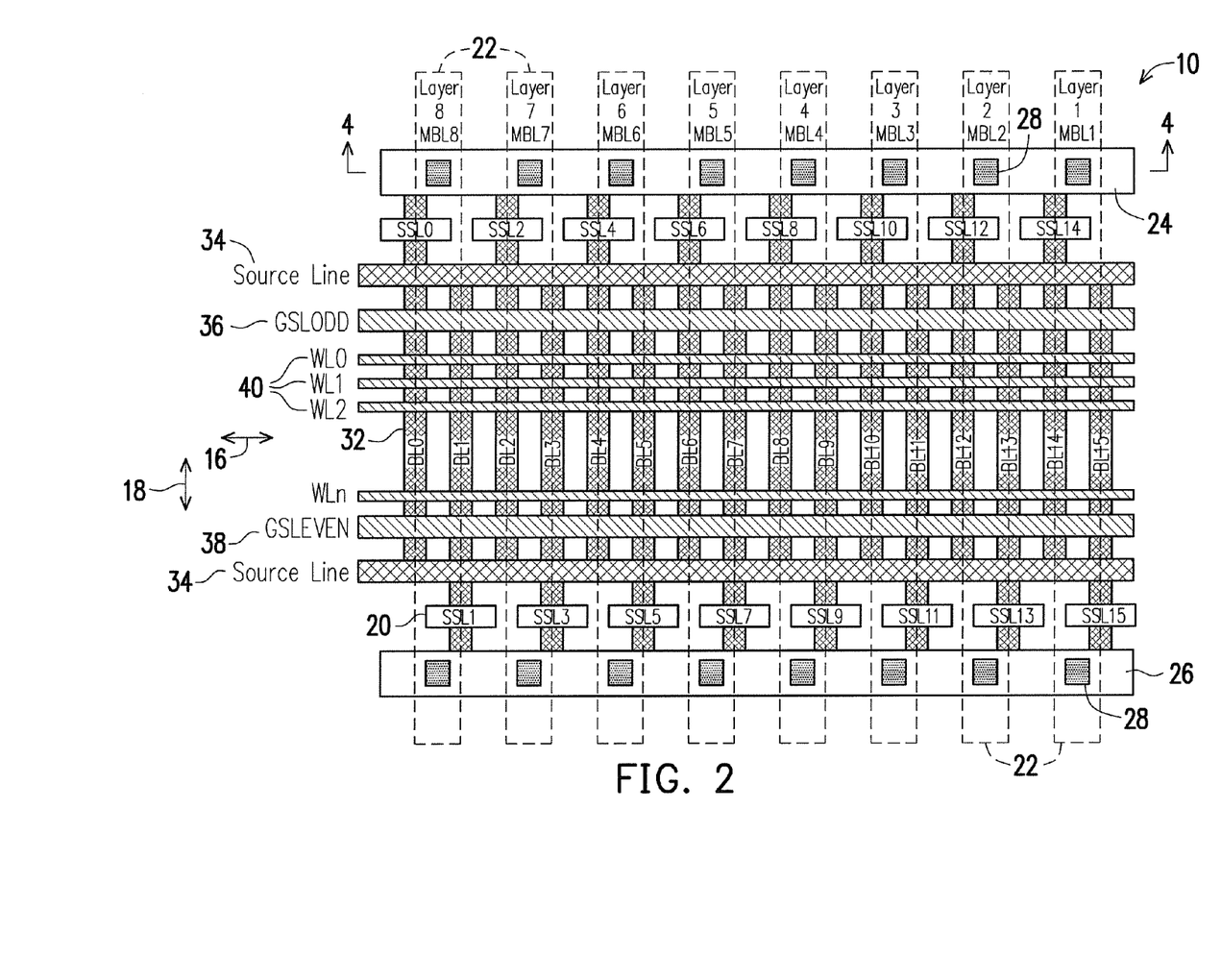

FIGS. 1 and 2 illustrate a 3-D memory device 10 including a block 12 of memory cells. The 3-D memory device 10 is disclosed in U.S. Pat. No. 8,587,998, issued on Nov. 19, 2013 and entitled "3D Memory Array with Read Bit Line Shielding", which is incorporated by reference herewith. Block 12 of memory cells includes eight levels 13 being shown in FIG. 1. Each of the levels 13 includes strings of memory cells. Memory device 10 also includes a series of word lines 14. Word lines 14 extend in a first direction 16 and the strings of memory cells extend in a second direction 18. String select lines 20 extend in the first direction 16 and are electrically connected to selected ones of the strings of memory cells via string select switches located at ends of the strings. The string select lines 20 in this configuration are connected to stacks of string select switches, one on each level, so that an SSL line signal selects a stack of lines, not just one line. String select switches are typically transistors. Memory device 10 also includes global bit lines 22, sometimes designated in the figures as metal bit lines MBL, which extend in second direction 18, coupled to first and second bit line structures 24, 26, sometimes referred to as bit line pads, at each level 13 by bit line plugs 28. First and second bit line structures 24, 26 are arranged one on top of one another in a third direction 30 and are positioned at the first and second ends of block 12 of the memory cells. Thus, memory cells at each level 13 have a first bit line structure 24 at the first end connected to the memory cells, and a second bit line structure 26 at the second end connected to the memory cells. As shown, eight global bit lines 22 are used with eight levels 13 of bit line structures 24, 26.

Memory device 10 also includes local bit lines 32, shown in FIG. 2, within block 12 of the memory cells extending in second direction 18. It is seen that there are two local bit lines 32 for each global bit line 22. Memory device 10 includes other features including source lines 34, ground select odd lines 36, ground select even lines 38 and word lines 40, all extending in first direction 16.

Figure 3:
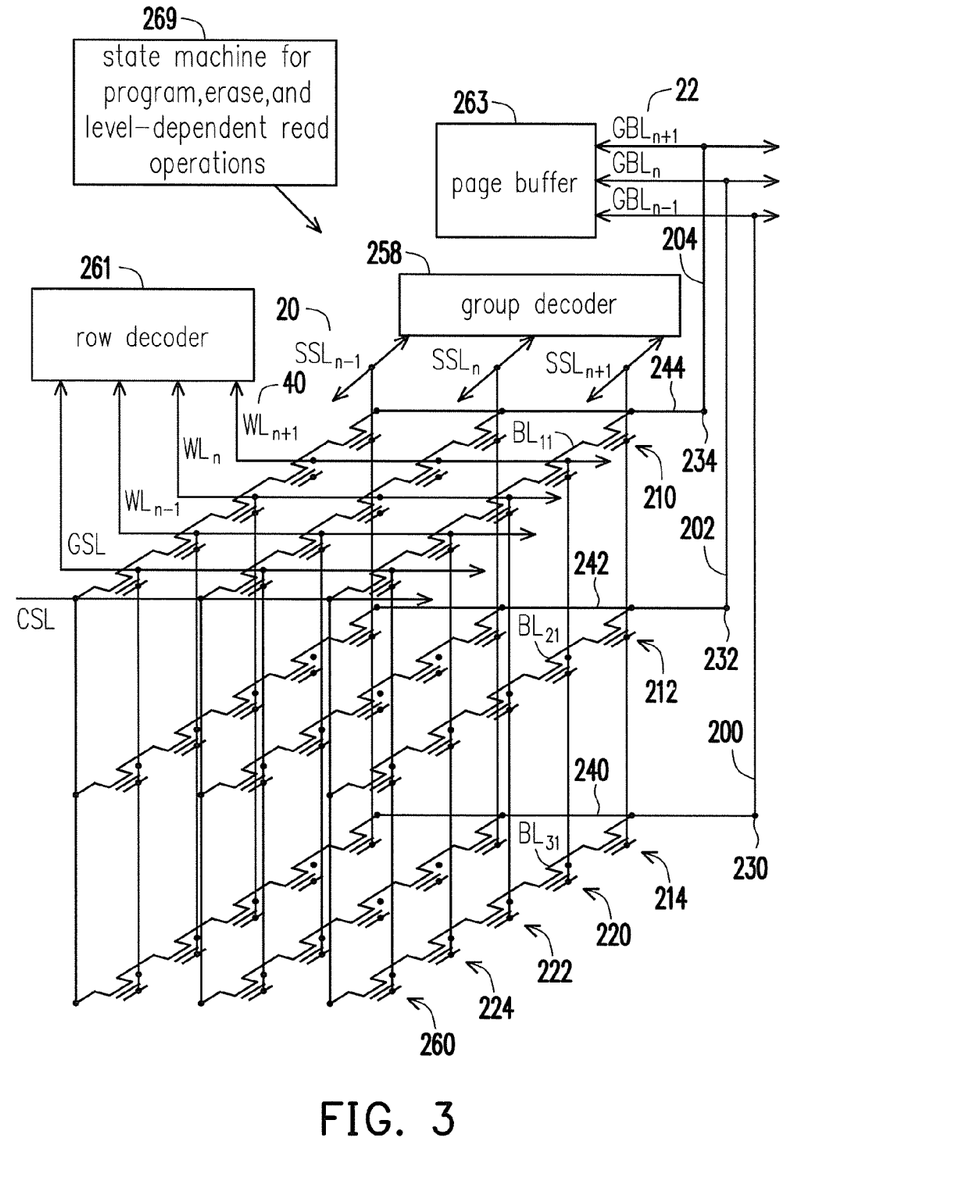
FIG. 3 is a schematic diagram of a portion of an example of a 3D NAND flash memory array used to illustrate three levels of memory cells, which is representative of a block of memory cells that can include many levels.

FIG. 3 is a schematic diagram of a portion of an example of a 3D NAND flash memory array used to illustrate three levels of memory cells, which is representative of a block of memory cells that can include many levels.

A plurality of word lines including word lines WLn−1, WLn, WLn+1 extend in parallel along first direction 16. The word lines are in electrical communication with row decoder 261. The word lines are connected to the gates of the memory cells, which are arranged in series as NAND strings. Word line WLn is representative of the word lines. As shown in FIG. 2, the word line WLn is vertically connected to the gates of the memory cells in each of the various levels underlying the word line WLn.

A plurality of local bit lines is arranged along columns to form NAND strings in the various levels of the memory array. The array includes a local bit line BL31 on the third level, a local bit line BL21 on the second level, and local bit line BL11 on the first level. The memory cells have dielectric charge trapping structures between the corresponding word lines and the corresponding local bit lines. In this illustration, there are three memory cells in a NAND string for simplicity. For example, a NAND string formed by local bit line BL31 on the third level comprises memory cells 220, 222, 224. In a typical implementation, a NAND string may comprise 16, 32 or more memory cells.

A plurality of string select lines including string select lines SSLn−1, SSLn, SSLn+1 (20) are in electrical communication with group decoder 258 (which could be part of the row decoder 261), which selects a group of strings. The string select lines are connected to the gates of string select transistors arranged at the first ends of the memory cell NAND strings. Each of the string select lines is vertically connected to the gates of a column of the string select transistors in each of the various levels. For example, string select line SSLn+1 is connected to the gates of string select transistors in the three levels.

The local bit lines on a particular level are selectively coupled to an extension on the particular level by the corresponding string select transistors. For example, the local bit lines on the third level are selectively coupled to extension 240 by the corresponding string select transistors in that level. Similarly, the local bit lines on the second level are selectively coupled to extension 242, and local bit lines on the first level are selectively coupled to extension 244.

The extensions on each of the levels include a corresponding contact pad for contact with a vertical connector coupled to a corresponding global bit line. For example, extension 240 in the third level is coupled to a global bit line GBLn−1 via contact pad 230 and vertical connector 200. Extension 242 on the second level is coupled to a global bit line GBLn via contact pad 232 and vertical connector 202. Extension 244 on the third level is coupled to a global bit line GBLn+1.

The global bit lines GBLn−1, GBLn, and GBLn+1 (22) are coupled to additional blocks (not shown) in the array and extend to page buffer 263. In this manner a 3D decoding network is established, in which a page of selected memory cells is accessed using one word line, all or some of the bit lines and one string select line.

Block select transistors are arranged at the second ends of the NAND strings. For example, block select transistor 260 is arranged at the second end of the NAND string formed by memory cells 220, 222, 224. A ground select line GSL is connected to the gates of the block select transistors. The ground select line GSL is in electrical communication with the row decoder 261 to receive bias voltages during operations.

The block select transistors are used to selectively couple second ends of all the NAND strings in the block to a reference voltage provided on common source line CSL. The common source line CSL receives bias voltages from the bias circuit (not shown here) during operations. In some operations, the CSL is biased to a reference voltage that is lower than that of a bit line coupled to the opposite end of a NAND string, at or near ground.

Figure 4:
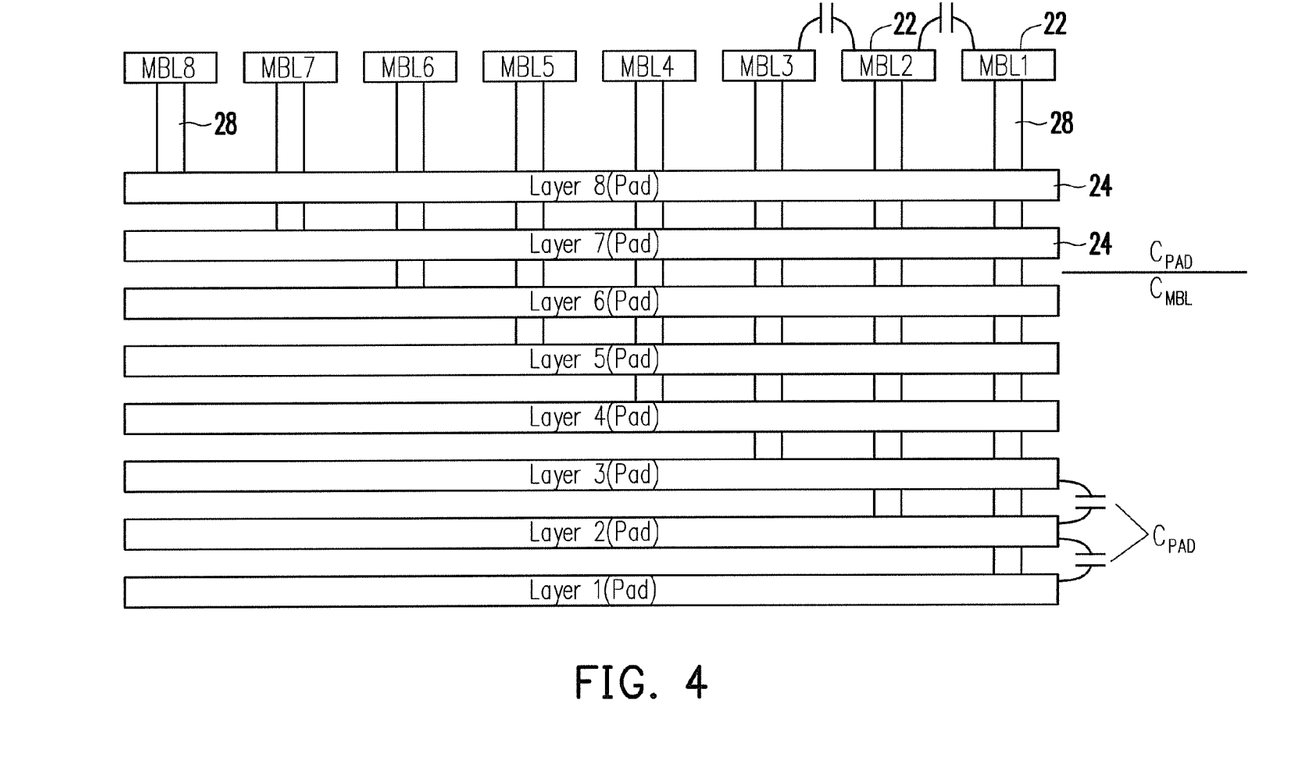
FIG. 4 illustrates major bit-line loading of some 3-D memory devices, such as device of FIGS. 1 and 2.

The major bit-line loading of some 3-D memory devices, such as device 10 of FIGS. 1 and 2, are illustrated in FIG. 4. That is, the major bit-line loading is from both the adjacent global bit lines and the adjacent bit-line pads. The adjacent global bit lines 22 results in global bit line capacitive coupling, indicated by $C_{MBL}$ in FIG. 4, and bit line structure (sometimes referred to as bit line pad) capacitive coupling, indicated by $C_{PAD}$ in the figure.

The drawback of the 3-D memory structure of the prior art is that the read throughput is reduced because of the need to shield the adjacent bit line coupling effect. In each read, either even or odd global bit lines are read. The adjacent global bit lines serve a shielding purpose. In this kind of the memory structure, only one-second of the bit lines is accessed in one read operation.

Figure 5A:
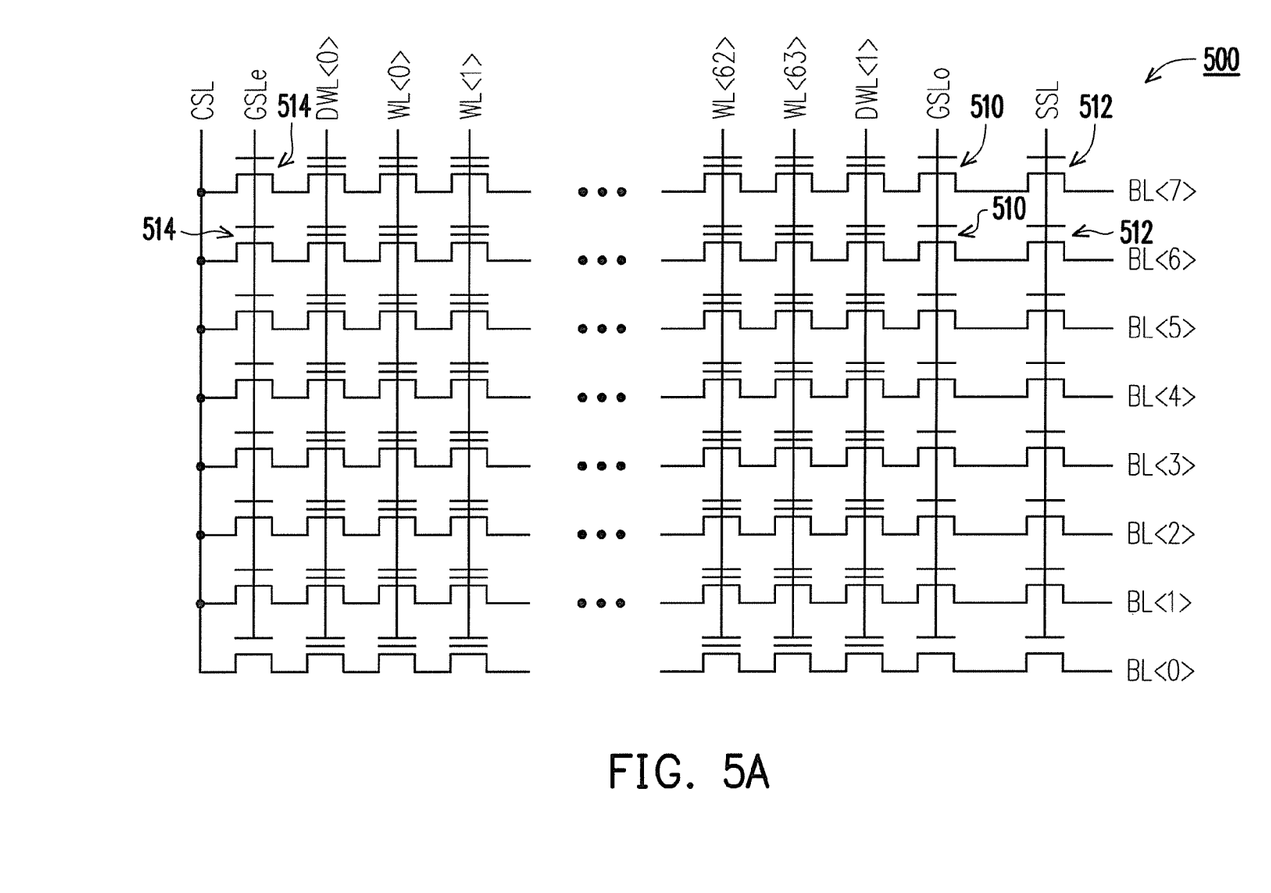
FIG. 5A schematically illustrates a schematic equivalent circuit of a 3D NAND flash memory.

Please refer to FIG. 5A, which schematically illustrates a schematic equivalent circuit of a 3D NAND flash memory in an even group of strings. Each bit line (BL) of an 8-metal BL set is connected to its own memory layer within 16-string pitch. For example, metal bit line BL<0> is connected to a first layer, BL<1> is to a second layer, and so on. In each bit line, a dummy transistor 510 controlled by an odd ground select line (GSLo) is disposed next to a string select switches 512 controlled by a string select line (SSL). The dummy transistors can be erased or programmed bit-by-bit. At the other end of the bit line has block select transistor 514 controlled by an even ground select line (GSLe) next to a common source line (CSL). The 8-metal BL set includes four bit line pairs, includes four odd bit lines and four even bit lines.

Figure 5B:
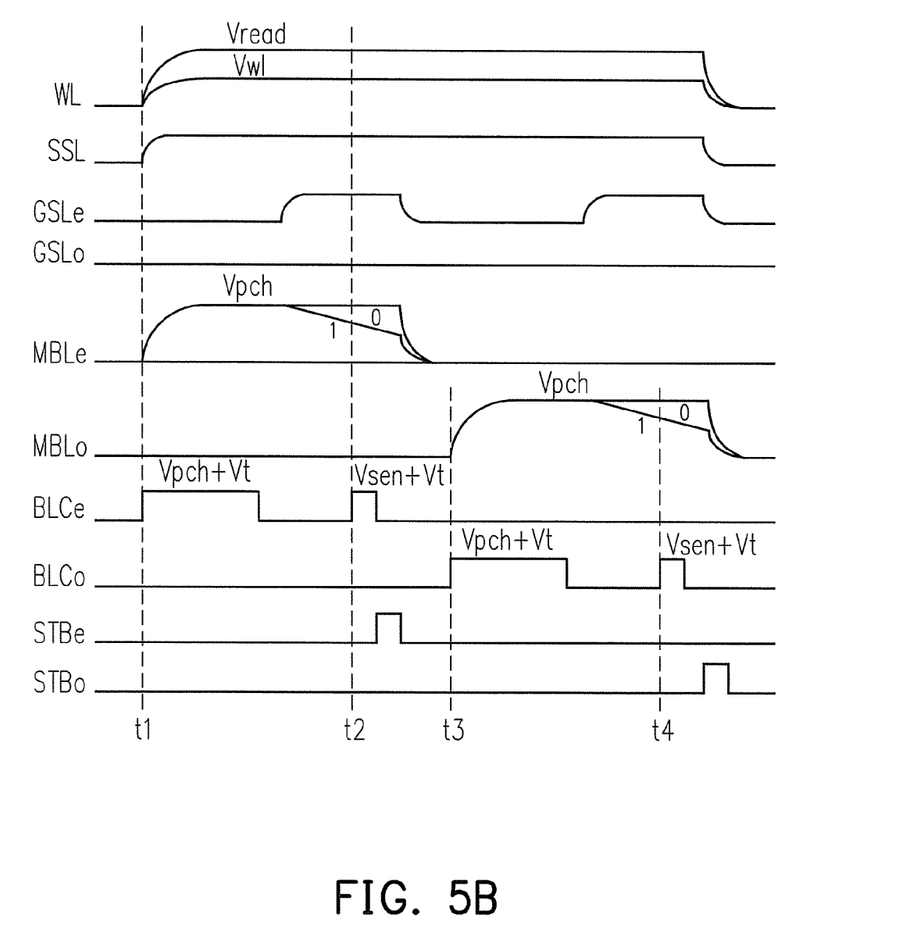
FIG. 5B shows waveforms associated with FIG. 5A for separate sensing between even and odd bit lines in the odd-even architecture.

Please refer to FIG. 5B, which shows waveforms associated with FIG. 5A for separate sensing between even and odd bit lines in the odd-even architecture. When the memory cells associated with the even bit line MBLe (for example, metal bit lines BL<0>, BL<2>, BL<4>, BL<6> in FIG. 5A) are sensing, each even bit line MBLe is pre-charged to a voltage level Vpch starting at time t1 by applying a voltage Vpch plus a threshold voltage Vt to the corresponding transfer gate drive signal BLCe for the even bit line MBLe. During the time for even bit line sensing, the voltage level of each odd bit line MBLo (for example, metal bit lines BL<1>, BL<3>, BL<5>, BL<7> in FIG. 5A) is fixed at ground to shield from the BL-BL coupling noise. After a sensing pulse (Vsen plus Vt) is applied to the corresponding transfer gate drive signal BLCe at time t2 to sense the data stored in the corresponding memory cells, the voltage level at each even bit line MBLe is discharged to ground.

At time t3, after the voltage level at each even bit line MBLe is discharged to ground, the memory cells associated with the odd bit line MBLo starts sensing, each odd bit line MBLo is pre-charged to a voltage level Vpch starting at time t3 by proving a voltage Vpch plus a voltage Vt to the corresponding transfer gate drive signal BLCo for the odd bit line MBLo. During the time for odd bit line sensing, the voltage level of each even bit line MBLe is fixed at ground to shield from the BL-BL coupling noise.

Separate sensing between the even and odd bit lines can avoid bit line to bit line (BL-BL) coupling noise during sensing. The separate sensing between even and odd bit lines is more reliable and is easier to design than all BL simultaneous sensing, however, the read time is much longer.

In one of exemplary embodiments, the invention provides a consecutive sensing method for a flash memory to improve read time of separate sensing in each bit line pair, as in between even bit lines ("BL" for Bit line, hereinafter) and odd BLs. In one of exemplary embodiments, the consecutive sensing method improves read time of even/odd BL separate sensing by, for example, pre-charge time saving for sensing each of the bit lines.

In one example, when the even bit lines are sensing, both even/odd BLs are pre-charged to a voltage level Vpch together, and odd BLs are fixed at Vpch for shielding during the even BLs sensing. The pre-charge time for the bit lines can be shortened because effective bit line load capacitance is much lower. After even BL sensing, the even bit lines are discharged to ground for shielding during odd BL sensing. When the even BL is discharged, the odd BLs may suffer coupling noise, but odd BL recovery time should be shorter than BL pre-charge time from ground.

In another example, the aforesaid method can also be applied to a case that the odd bit lines are sensing first. When the odd bit lines are sensing, both even/odd BLs are pre-charged to a voltage level Vpch together, and even BLs are fixed at Vpch for shielding during the odd BLs sensing.

Figure 6A:
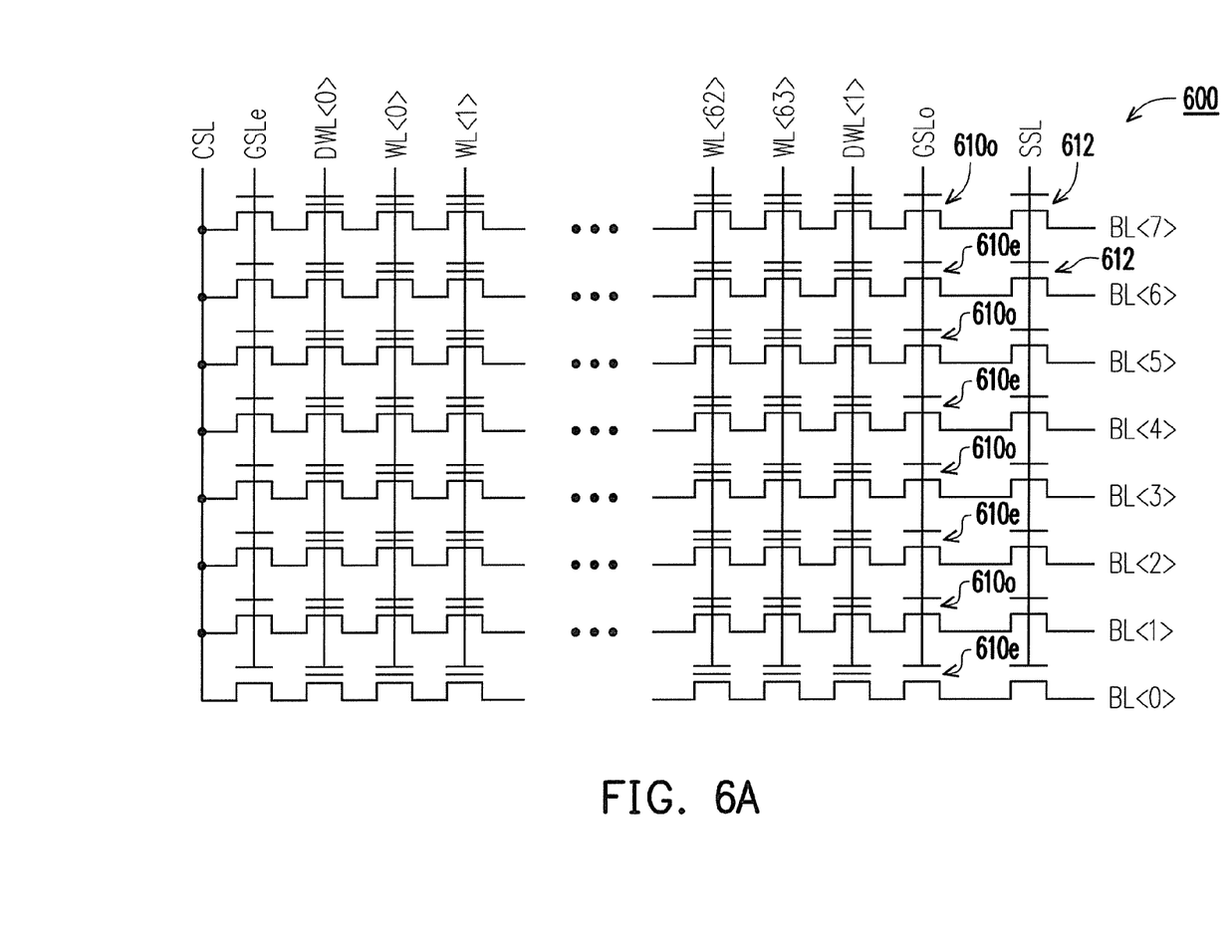
FIG. 6A schematically illustrates a schematic equivalent circuit of a 3D NAND flash memory.
Figure 6B:
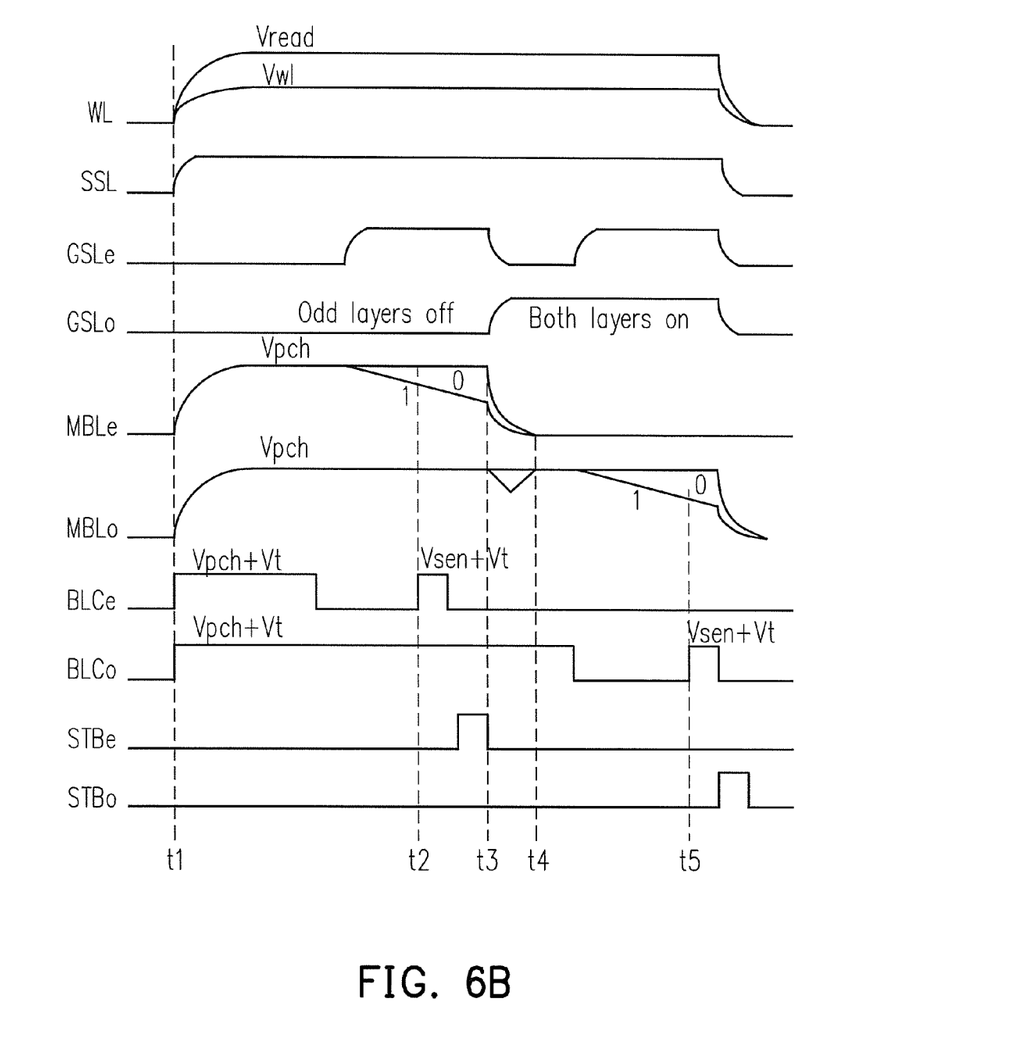
FIG. 6B shows waveforms associated with FIG. 6A for separate sensing between even and odd bit lines in the odd-even architecture.
Figure 6C:
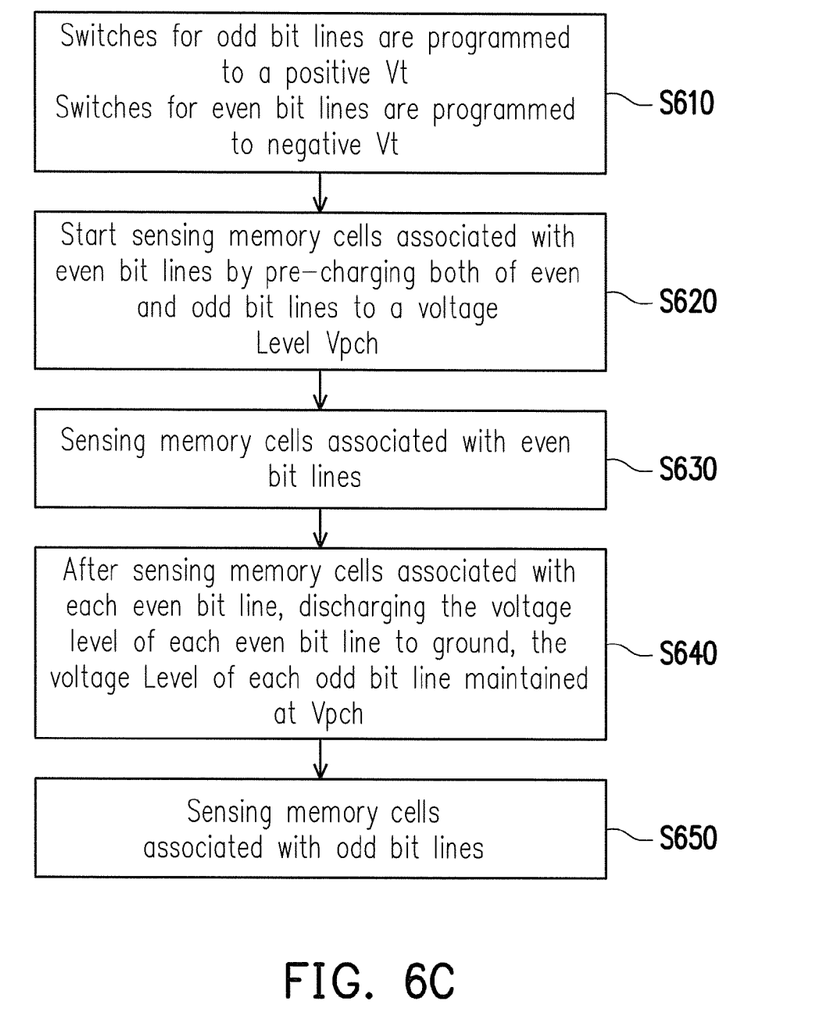
FIG. 6C illustrates a flow chart for the sensing method in one of exemplary embodiment.

Please refer to FIGS. 6A, 6B and 6C for illustrating a consecutive sensing method for a flash memory to improve read time of separate sensing in even/odd architecture in one of exemplary embodiment.

Please refer to FIG. 6A, which schematically illustrates a schematic equivalent circuit of a 3D NAND flash memory, similar to FIG. 5A. The 3D NAND flash memory 600 provides even/odd architecture. In the structure, for example, metal bit line BL<0> is connected to a first layer, BL<1> is to a second layer, and so on. For bit lines, dummy transistors controlled by an odd ground select line (GSLo) are disposed next to a string select switches 612 controlled by a string select line (SSL), and at the other end of the bit lines has corresponding block select transistors controlled by an even ground select line (GSLe) next to a common source line (CSL). The dummy transistors 610e are respectively corresponding to the even metal bit lines BL<0>, BL<2>, BL<4> and BL<6>. The dummy transistors 610o are respectively corresponding to the odd metal bit lines BL<1>, BL<3>, BL<5> and BL<7>. These dummy transistors can be erased or programmed bit-by-bit.

To realize the method of the embodiment, in a case that 3D NAND flash memory provides even/odd architecture and one metal bit line BL is arranged in a two-string pitch, the dummy transistors 610o controlled by the odd ground select line (GSLo) for odd layers are programmed to a positive threshold voltage Vt, and dummy transistors 610e controlled by the odd ground select line (GSLo) for even layers are erased to negative threshold voltage Vt in advance.

Please refer to FIG. 6B, which shows waveforms associated with FIG. 6A for separate sensing between even and odd bit lines in the odd-even architecture. In the embodiment, as shown, when the memory cells associated with the even bit line MBLe are sensing, all of the even bit lines MBLe and the odd bit lines MBLo are simultaneously pre-charged to a voltage level Vpch starting at time t1 by applying a voltage Vpch plus a threshold voltage Vt to the corresponding transfer gate drive signal BLCe for the even bit lines MBLe and BLCo for the odd bit lines MBLo.

The voltage levels of each odd bit line MBLo are maintained at the voltage level Vpch to shield from the BL-BL coupling noise. After a sensing pulse (Vsen plus Vt) is applied to the corresponding transfer gate drive signal BLCe at time t3 to sense the data stored in the corresponding memory cells, the voltage level at each even bit line MBLe is discharged to ground. During the time, each odd bit line MBLo is maintained at the voltage level Vpch.

During the time period from time t3 to time t4, the voltage level at each even bit line MBLe is discharged to ground for shielding during the odd bit lines MBLo are sensing. When the even bit lines MBLe are discharged, the odd bit lines MBLo may suffer coupling noise, but the recovery time (from t3 to t4) for the odd bit lines MBLo to reach the voltage level Vpch is still much shorter than the pre-charge time from the ground for the metal bit lines. A sensing pulse (Vsen plus Vt) is applied to the corresponding transfer gate drive signal BLCo at time t5 to sense the data stored in the corresponding memory cells, the voltage level at each odd bit line MBLo is maintained at the ground level.

Please refer to FIG. 6C, which illustrates a flow chart for the consecutive sensing method in one of exemplary embodiment. In the method, as in step S610, switches for odd bit lines controlled by the odd ground select line (GSLo) are programmed to a positive threshold voltage Vt. At the same time, switches controlled by the odd ground select line (GSLo) for even bit lines are erased to negative threshold voltage Vt in advance. In step S620, start sensing memory cells associated with the even bit lines by pre-charging both of even and odd bit lines to a voltage level Vpch. In step S630, maintain the voltage level of the odd bit lines at Vpch and sense memory cells associated with the even bit lines. In step S640, after data stored in the memory cells associated with the even bit lines are sensed, the voltage level of each even bit line is discharged to ground, and the voltage level of each odd bit line is maintained at Vpch. In step S650, data stored in the memory cells associated with the odd bit lines are sensed.

In this example, even BLs are sensed first, and then odd BLs are sensed. BL pre-charge is done for both even/odd BLs. Because effective BL-BL capacitance can be almost zero, BL pre-charge time can be faster.

Figure 7:
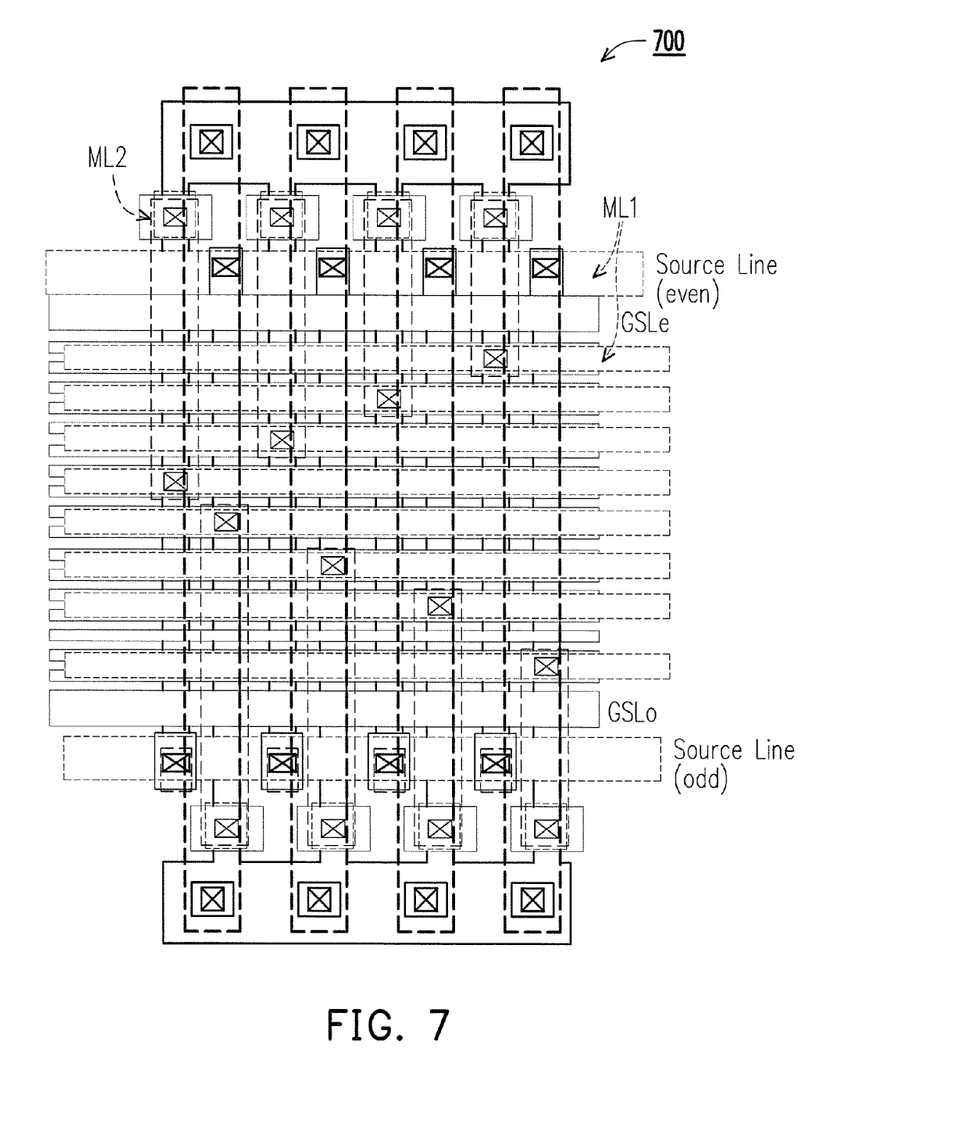
FIG. 7 schematically illustrates a 3D NAND flash memory suitable for a sensing method of exemplary embodiments of the invention.

Please refer to FIG. 7, which schematically illustrates a 3D NAND flash memory suitable for a consecutive sensing method of exemplary embodiments of the invention. The 3D NAND flash memory 700 provides even/odd architecture and one metal bit line BL is arranged in a two-string pitch. Each BL of an 8-metal BL set is connected to its own memory layer within 16-string pitch. There are 2N pages of memory cells in the 3D NAND flash memory 700, and N is the number of stack layer number. The 3D NAND flash memory 700 further includes an odd ground select line (GSLo) controlling connection between an odd source line and the corresponding memory cells, and includes an even ground select line (GSLe) controlling connection between an even source line and the corresponding memory cells.

Figure 8A:
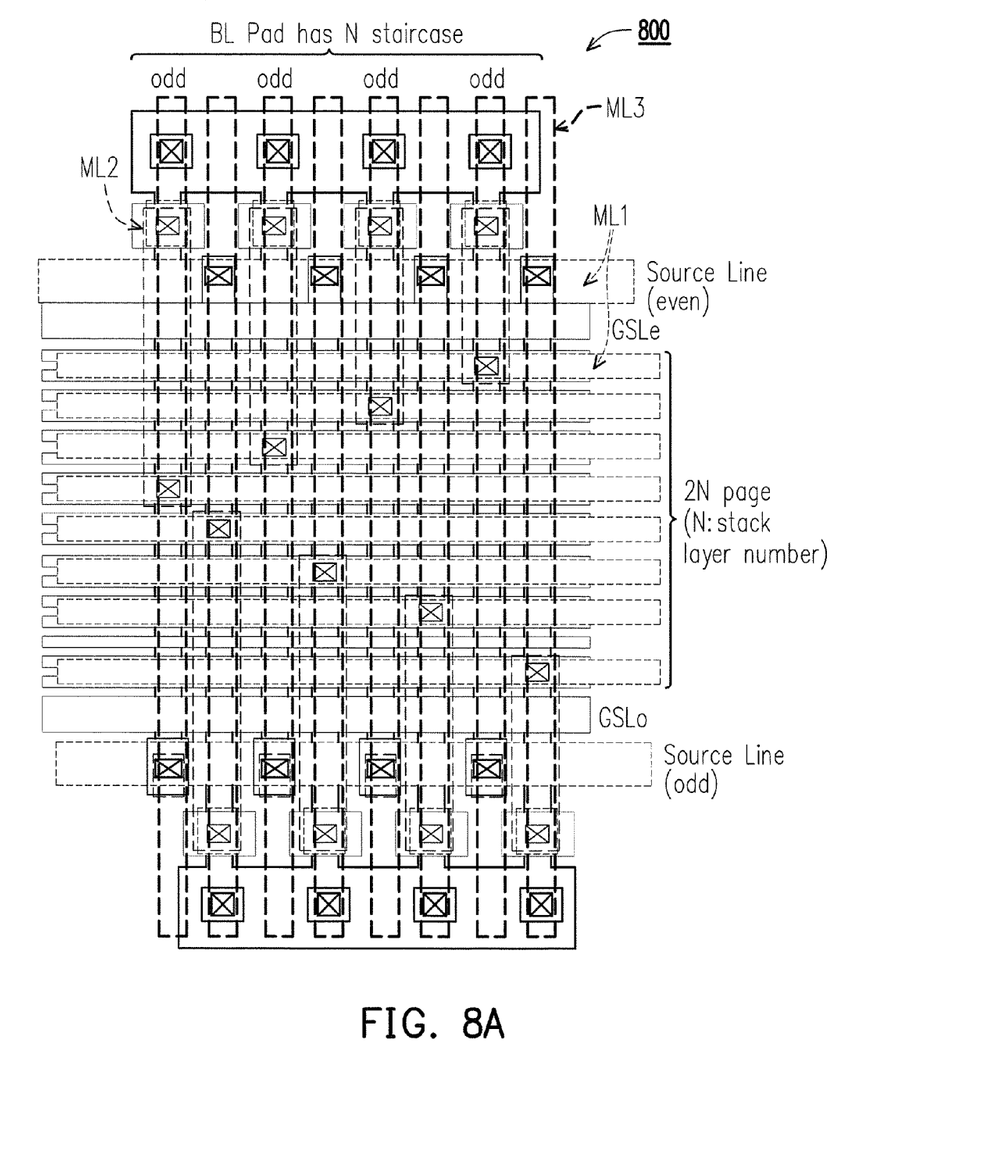
FIG. 8A schematically illustrates another 3D NAND flash memory suitable for a sensing method of exemplary embodiments of the invention.

Please refer to FIG. 8A, which schematically illustrates another 3D NAND flash memory suitable for a consecutive sensing method of exemplary embodiments of the invention. The 3D NAND flash memory 800 provides even/odd architecture and one metal bit line BL is arranged in a one string pitch. Each of even metal bit lines and odd metal bit lines are connected either side of fingers with its own string select switch (SSL), while in the structure of FIG. 7; each BL is connected to both of the fingers. There are 2N pages of memory cells in the 3D NAND flash memory 800, and N is the number of stack layer number. The 3D NAND flash memory 800 further includes an odd ground select line (GSLo) controlling connection between an odd source line and the corresponding memory cells, and includes an even ground select line (GSLe) controlling connection between an even source line and the corresponding memory cells.

Figure 8B:
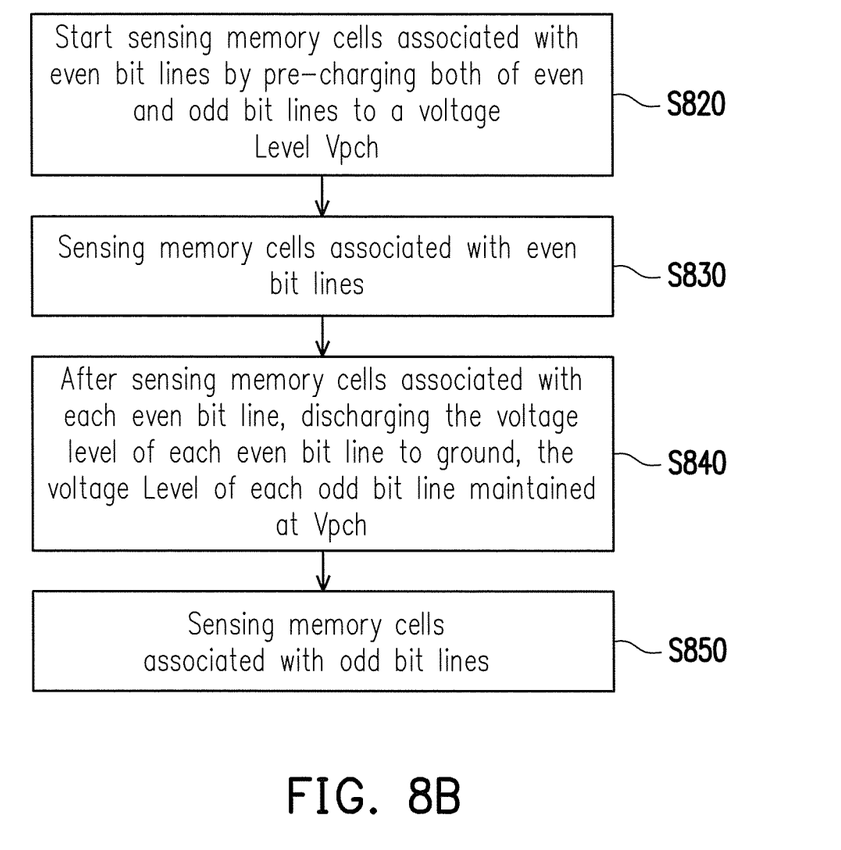
FIG. 8B illustrates a flow chart for the sensing method in one of exemplary embodiment.

Please refer to FIG. 8B, which illustrates a flow chart for the consecutive sensing method in one of exemplary embodiment. In the method, not like the method in FIG. 6C, in which switches for odd bit lines have to be programmed to a positive threshold voltage Vt, and switches for even bit lines have to be erased to negative threshold voltage Vt in advance. In the method, as in step S820, start sensing memory cells associated with the even bit lines by pre-charging both of even and odd bit lines to a voltage level Vpch. In step S830, maintain the voltage level of the odd bit lines at Vpch and sense memory cells associated with the even bit lines. In step S840, after data stored in the memory cells associated with the even bit lines are sensed, the voltage level of each even bit line is discharged to ground, and the voltage Level of each odd bit line is maintained at Vpch. In step S850, data stored in the memory cells associated with the odd bit lines are sensed.

One or some of embodiments of the invention provide at least a consecutive sensing method for a flash memory to improve read time of separate sensing between even bit BLs and odd BLs. The consecutive sensing method improves read time of even/odd BL separate sensing by, for example, pre-charge time saving for sensing each of the bit lines. The embodiments of the invention may be applied to a 3D NAND flash memory, 2D NAND flash memory, or any other flash memory, which may have a plurality of bit line pairs, and each of the bit line pair comprising an odd bit line and an even bit line. In one of exemplary embodiments, the consecutive sensing method provided in the invention can be applied to a two-dimensional NAND flash memory having a plurality of bit line pairs, each bit line in the bit line pair is arranged for 2-string. The two-dimensional NAND flash memory is provided, for example, in US 20120148676A1 and is incorporated herewith by reference. In other exemplary embodiment, the consecutive sensing method provided in the invention can be applied to a two-dimensional NAND flash memory having a plurality of bit line pairs, each bit line in the bit line pair is arranged for one-string. When the even bit lines are sensing, both even/odd BLs are pre-charged to a pre-charge level Vpch together, and odd BLs are fixed at Vpch for shielding during the even BLs sensing. The pre-charge time for the bit lines can be shortened because effective bit line load capacitance is much lower. After even BL sensing, the even bit lines are discharged to ground for shielding during odd BL sensing. When the even BL is discharged, the odd BLs may suffer coupling noise, but odd BL recovery time should be shorter than BL pre-charge time from ground.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A sensing method for a memory device, the memory device comprising an odd bit line and an even bit line in a plurality of bit lines, the method comprising:
    charging both of the even bit line and the odd bit line to a first level; and
    maintaining the voltage level of the odd bit line at the first level while sensing memory cells associated with the even bit line,
    wherein after sensing the memory cells associated with the even bit line and before sensing the memory cells associated with the odd bit line, the voltage level of the even bit line is discharged to ground, and the voltage level of the odd bit line is maintained at the first level.

2. The sensing method of claim 1, wherein the memory device comprises a block of memory cells comprising a plurality of levels, each level comprising the memory cells extending between first and second ends of the block of memory cells, each of the even bit lines and the odd bit lines being operably coupled to a string of the memory cells through a switch,
    before charging both of the even bit line and the odd bit line, programming the switches controlling either the even bit lines or the odd bit lines to a positive threshold voltage and erasing the other ones to a negative threshold voltage.

3. The sensing method of claim 1, wherein the memory device comprises a block of memory cells, the block of memory cells comprising the memory cells extending between first and second ends of the block of memory cells, each of the even bit lines and the odd bit lines being operably coupled to a string of the memory cells through a switch,
    before charging both of the even bit line and the odd bit line, programming the switches controlling either one of the even bit lines or the odd bit lines to a positive threshold voltage and erasing the other one to a negative threshold voltage.

4. The sensing method of claim 1, wherein before charging both of the even bit line and the odd bit line of the bit lines, applying a first transfer gate drive signal to the even bit lines and a second transfer gate drive signal to the odd bit lines to conduct the charging.

5. A sensing method for a memory device, the memory device comprising a set of even bit lines operably coupled to first bit line structures at a first end of the memory device, and a set of odd bit lines operably coupled to second bit line structures at a second end of the memory device, the even and odd bit lines at each level being interleaved, the sensing method comprising:
    during a read operation:
        charging both of the even bit lines and the odd bit lines to a first level; and
        maintaining the voltage level of each of the odd bit lines at the first level while sensing the memory cells associated with each of the even bit lines,
        wherein after sensing the memory cells associated with the even bit line and before sensing the memory cells associated with the odd bit line, the voltage level of the even bit line is discharged to ground, and the voltage level of the odd bit line is maintained at the first level.

6. The sensing method of claim 5, wherein the memory device comprising the set of even bit lines operably coupled to the first bit line structures at a plurality of levels at the first end of the memory device, and the set of odd bit lines operably coupled to the second bit line structures at the plurality of levels at a second end of the memory device.

7. The sensing method of claim 5, wherein after sensing the memory cells associated with each of the even bit lines, the method further comprising
    discharging the voltage level of each of the even bit line to ground, while maintaining the voltage level of each of the odd bit line at the first level; and
    sensing the memory cells associated with the odd bit line.

8. The sensing method of claim 5, wherein the sensing method comprising
    before charging both of the even bit lines and the odd bit lines programming switches controlling either the even bit lines or the odd bit lines to a positive threshold voltage and erasing the other one to a negative threshold voltage.

9. The sensing method of claim 5, wherein before charging both of the even bit lines and the odd bit lines, applying a first transfer gate drive signal to the even bit lines and a second transfer gate drive signal to the odd bit lines to conduct the charging.

10. A memory device comprising:
    a block of memory cells comprising a plurality of levels, each level comprising strips of memory cells extending in a first direction between first and second ends of the block of memory cells;
    a first bit line structure at each level at the first end of the block of memory cells, each first bit line structure operably coupled to a first string of memory cells extending from said first end;

a second bit line structure at each level at the second end of the block of memory cells, each second bit line structure operably coupled to a second string of memory cells extending from said second end;

a plurality of bit line pairs extending in the first direction, each bit line pair comprising a first bit line and a second bit line, wherein each of the first bit lines or the second bit lines for a series of bit line pairs is separated by a bit line of an adjacent pair of the bit lines, a pre-charge circuit, during a read operation, pre-charging both of the first bit lines and the second bit lines, and optionally maintaining the voltage level of each of the first bit lines and the second bit lines at the pre-charge level; and a sensing circuit, during the read operation, sensing the memory cells associated with each of the first bit lines when the voltage level of each of the second bit lines is maintained at the pre-charge level.

11. The memory device of claim 10, further comprising first switches controlling the first bit lines being programmed to a positive threshold voltage and second switches controlling the second bit lines being erased to a negative threshold voltage.

12. The memory device of claim 10, wherein the first bit line is an even bit line and the second bit line is an odd bit line in each of the bit line pairs.

13. A memory device, comprising
a set of first bit lines operably coupled to first bit line structures at a plurality of levels at a first end of the memory device;

a set of even bit lines operably coupled to second bit line structures at the plurality of levels at a second end of the memory device, the first and second bit lines at each level being interleaved in each of bit line pairs;

a pre-charge circuit, during a read operation, pre-charging both of the first bit lines and the second bit lines, and maintaining the voltage level of each of the first bit lines and the second bit lines at the pre-charge level; and a sensing circuit, during the read operation, sensing the memory cells associated with each of the first bit lines when the voltage level of each of the second bit lines is maintained at the pre-charge level.

14. The memory device of claim 13, further comprising first switches controlling the first bit lines being programmed to a positive threshold voltage and second switches controlling the second bit lines being erased to a negative threshold voltage.

15. The memory device of claim 13, wherein the first bit line is an even bit line and the second bit line is an odd bit line in each of the bit line pairs.

* * * * *